United States Patent [19]
Kelem et al.

[11] Patent Number: 6,107,821
[45] Date of Patent: Aug. 22, 2000

[54] ON-CHIP LOGIC ANALYSIS AND METHOD FOR USING THE SAME

[75] Inventors: Steven H. Kelem, Los Altos Hills; Gary R. Lawman, San Jose, both of Calif.

[73] Assignee: Xilinx, Inc., San Jose, Calif.

[21] Appl. No.: 09/246,528

[22] Filed: Feb. 8, 1999

[51] Int. Cl.$^7$ ............................................... H03K 19/173
[52] U.S. Cl. ............................................... 326/38; 326/41
[58] Field of Search ........................................ 326/37–41

[56] References Cited

U.S. PATENT DOCUMENTS

| | | | |
|---|---|---|---|
| 5,646,545 | 7/1997 | Trimberger et al. | 326/38 |
| 5,764,076 | 6/1998 | Lee et al. | 326/41 |
| 5,841,867 | 11/1998 | Jacobson et al. | 326/39 |
| 6,020,758 | 2/2000 | Patel et al. | 326/40 |
| 6,046,603 | 4/2000 | New | 326/41 |
| 6,057,704 | 5/2000 | New et al. | 326/41 |

FOREIGN PATENT DOCUMENTS

| | | |
|---|---|---|
| 0919916A2 | 6/1999 | European Pat. Off. . |

OTHER PUBLICATIONS

"The Programmable Logic Data Book" published Sep. 1996, pp. 4–54 through 4–79, Xilinx, Inc., 2100 Logic Drive, San Jose, CA 95124.

*Primary Examiner*—Michael Tokar
*Assistant Examiner*—Don Phu Le
*Attorney, Agent, or Firm*—Edward S. Mao, Esq.; Bever, Hoffman & Harms; Lois D. Cartier

[57] ABSTRACT

A programmable logic device (PLD) includes a plurality of logic resources, a plurality of multi-bit configuration memories (MBCMs), and a trigger logic structure. The plurality of MBCMs include multiple memory slices that allow the PLD to switch rapidly between configurations, or contexts. In one embodiment, at least one memory slice configures the PLD into a logic analysis context for providing on-chip testing. In one embodiment, the plurality of logic resources include a plurality of storage elements. State data generated by a user-defined context is stored in the plurality of storage elements. When the trigger logic structure provides a trigger signal, the PLD is reconfigured into the logic analysis context. The logic analysis context reads and processes the state data stored in the plurality of storage elements to test the performance of the user-defined context. In one embodiment, the storage elements are multi-bit microregisters that store state data generated by a plurality of contexts implemented in the multiple-context PLD.

31 Claims, 8 Drawing Sheets

ON-CHIP LOGIC ANALYSIS AND METHOD FOR USING THE SAME

FIELD OF THE INVENTION

The present invention relates to programmable devices such as field programmable gate arrays (FPGAs), and more particularly to a FPGA including high-speed, on-chip logic analysis capability.

BACKGROUND OF THE INVENTION

Programmable logic devices (PLDs) such as field programmable gate arrays (FPGAs) and application specific integrated circuits (ASICs) are commonly-used integrated circuit (IC) devices. PLDs allow a user (e.g., a circuit designer) to design and operate customized sets of logic functions using a single chip. The widespread use of PLDs stems from this flexibility.

A conventional PLD such as an FPGA includes logic resources such as configurable logic blocks (CLBs), input/output blocks (IOBs), and a configurable interconnect structure (CIS). The logic resources are programmable to implement a user's circuit design.

Figure 1:
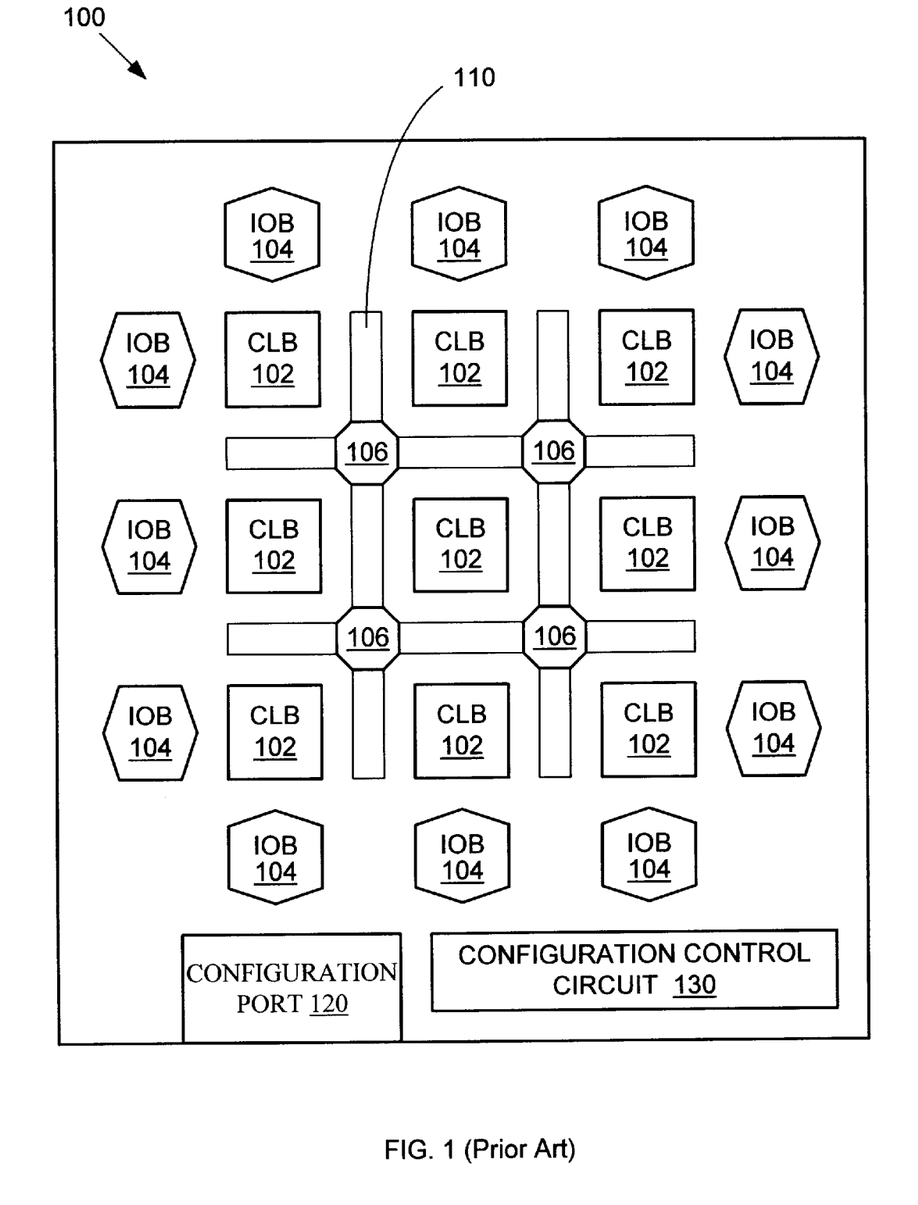
FIG. 1 is a simplified circuit diagram of a conventional Field Programmable Gate Array (FPGA).

FIG. 1 shows a simplified schematic diagram of a conventional FPGA 100. FPGA 100 comprises an array of CLBs 102, a plurality of IOBs 104, a CIS 110, a configuration port 120, and a configuration control circuit 130. CIS 110 includes a plurality of programmable switch matrices (PSMs) 106 that allow signals to be routed as desired between CLBs 102 and IOBs 104. CLBs 102 can be configured to perform various logic functions, while IOBs 104 can be configured to drive output signals or receive input signals from various pins (not shown) of FPGA 100.

FPGA 100 can also include dedicated internal logic. Dedicated internal logic performs specific functions and can be only minimally configured or are not configurable by a user. Configuration port 120 is an example of dedicated internal logic. Other examples may include power distribution grids (not shown) and dedicated clock nets (not shown).

FPGA 100 is illustrated with 9 CLBs 102, 12 IOBs 104, and 4 PSMs 106 for clarity only. Actual FPGAs may contain thousands of CLBs, hundreds of IOBs, and thousands of PSMs. The ratio of the number of CLBs, IOBs, and PSMs can also vary.

Figure 1A:
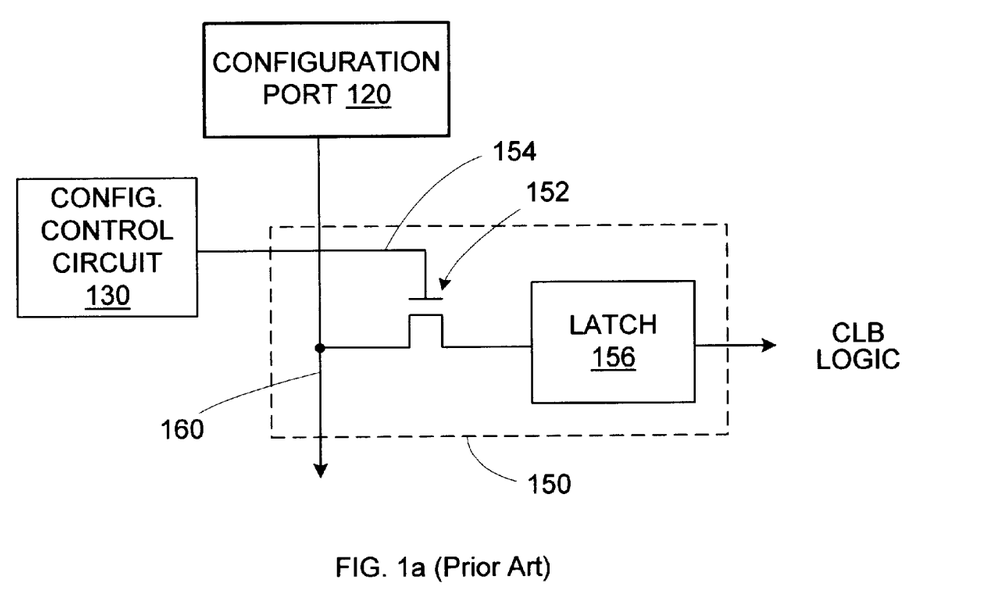
FIG. 1a shows a conventional configuration memory cell for a logic resource in a PLD.

Logic resources such as CLBs 102 and IOBs 104 generally include one or more function generators and one or more storage elements (e.g., flip-flops) connected by programmable interconnect lines, while logic resources used for signal transmission and routing such as PSMs 106 generally include only the programmable interconnect lines. However, each CLB 102, IOB 104, and PSM 106 also includes at least one programmable element (not shown) that is configured by a configuration bit from a configuration memory cell (FIG. 1a). Therefore, a single logic resource having multiple programmable elements is connected to multiple configuration memory cells. All the configuration memory cells associated with a particular logic resource must be programmed (or set to a default value) before that logic resource can perform its desired function.

FIG. 1a shows a conventional configuration memory cell 150. Typically, one or more such configuration memory cells are used to control each programmable element in an FPGA. Configuration memory cell 150 is a 5-transistor memory cell comprising a conventional latch 156 (i.e., a 4-transistor device) and a select transistor 152. Select transistor 152 is coupled between a configuration bus 160 and an input terminal of latch 156, with the control terminal of select transistor 152 being coupled to a configuration select line 154. During the configuration process, data received at configuration port 120 is passed to configuration bus 160. Configuration control circuit 130 (FIG. 1) controls whether a desired configuration bit from configuration bus 160 can be loaded into latch 156. To load latch 156, configuration control circuit 130 pulls configuration select line 154 to a logic high state. During operation of the FPGA, latch 156 provides the stored configuration bit to the programmable element of the logic resource (i.e., CLB, IOB, or PSM) associated with configuration memory cell 150.

The configuration, or "context", of an FPGA is defined by the set of configuration bits that configures the programmable elements of the logic resources of the FPGA. The set of configuration bits associated with a particular user-defined context (UC) is referred to as a "memory slice". A configuration data stream is used to load a particular memory slice defining a user-defined context into the configuration memory cells of an FPGA. Configuration port 120 provides an interface for external configuration devices (not shown) to provide the configuration data stream to FPGA 100. The configuration memory cells are typically daisy-chained together by a configuration bus (not shown) and are thus programmed sequentially under the control of configuration control circuit 130. Because of the serial nature of the programming process, FPGA configuration can be time-consuming. Specific examples for configuring various FPGAs can be found on pages 4–54 to 4–79 of "The Programmable Logic Data Book," published in September, 1996 by Xilinx, Inc., 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.)

A UC becomes "active" once its associated memory slice controls the programmable elements of a PLD. Once active, the operation of the UC can be verified by a logic analysis circuit that analyzes state data generated at specific locations ("test nodes") within the PLD. The logic analysis circuit typically reads and processes the state data in response to a trigger signal. The trigger signal can be generated by pre-specified events within the PLD or can simply be a periodic, clocked function.

The logic resources of a conventional PLD can be configured to provide a logic analysis circuit, i.e., a circuit that provides stimulus for, observes, and/or analyzes logic values in a circuit under test. However, a conventional PLD is generally heavily utilized, leaving few, if any, available logic resources free for the logic analysis circuit. This resource limitation dictates that the logic analysis circuit be external to the PLD (off-chip). However, the state data from the test nodes in the PLD must still be distributed to the external logic analysis circuit at appropriate times. In a conventional PLD, a portion of the logic resources are configured as "probe circuits", which provide both triggering functions and the transference of state data from the test nodes to various pins. Although the probe circuits consume a portion of the available logic and routing resources, this portion is much smaller than would be required by a logic analysis circuit.

Figure 2:
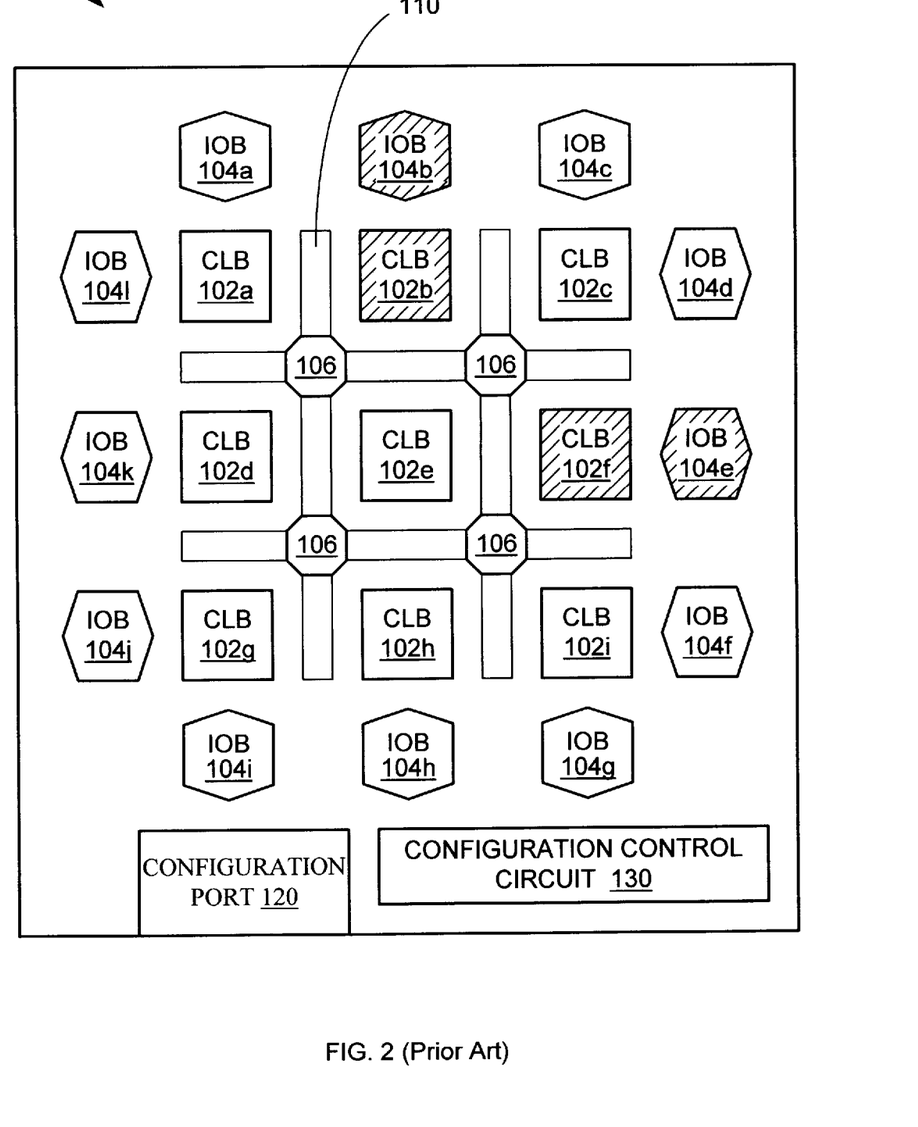
FIG. 2 is a simplified circuit diagram of a conventional FPGA configured to include probe function capability.

FIG. 2 shows a conventional FPGA 200 having a portion of its logic and routing resources configured as probe functions. FPGA 200 is similar to FPGA 100, comprising CLBs 102a–102i surrounded by IOBs 104a–104l, a CIS 110, a configuration port 120, and a configuration control circuit 130. CLBs 102b and 102f and IOBs 104b and 104e

(shown shaded) are configured to provide probe circuits for testing of the UC in the remaining CLBs and IOBs.

The use of probe circuits to gather the data for verification of a UC provides great flexibility in the selection of trigger logic and test nodes. The logic and routing resources used to provide the probe circuits are from the same pool of resources used by the active UC. Therefore, the probe circuits have direct access to the test nodes of the active UC.

However, the use of otherwise general-purpose CLBs and IOBs to create the probe circuits reduces the logic and routing resource available for the desired UC. Therefore, in heavily utilized PLDs, resource limitations may curtail the effectiveness of probe circuit testing. Either a reduced number of probe circuits may be used to perform partial testing of the UC, or the UC itself may be only partially configured (i.e., portions of the desired logic may be eliminated from the UC), to make additional logic and routing resources available for the probe functions. Neither option is completely satisfactory. Partial testing can be time-consuming if multiple test runs must be made to cover the full range of UC operation. In addition, partial testing may fail to detect problems associated with the full UC. On the other hand, partially configuring the UC can potentially alter the performance of the UC. Further, the inclusion of probe functions in the PLD along with the UC can affect the performance of the UC. The additional gates, gate activity, and routing modifications can generate noise and signal delays in the UC, leading to erroneous test results.

Another problem associated with probe function testing is that a large number of pins may be required to transmit the state data to the external logic analyzer. Typically, one pin is used to transfer the state data from each test node being examined. The active UC requires a certain number of pins for its own data input/output activity. Because the total number of pins in a PLD package is limited, typically either the UC must be modified or the test abridged.

To reduce the number of pins required for test purposes, a technique called Level Sensitive Scan Design (LSSD) testing is sometimes used. In LSSD testing, the state data from the test nodes are combined into a single scan chain that is transmitted to the logic analyzer. The scan chain is transmitted to the logic analyzer through a single pin, thereby minimizing the number of pins required for the testing process. However, because of this serial transfer of the state data, the time required for testing is increased. Also, the lengthy data output delays required by the LSSD testing process make it impractical for verification of high-speed UCs.

Figure 3:
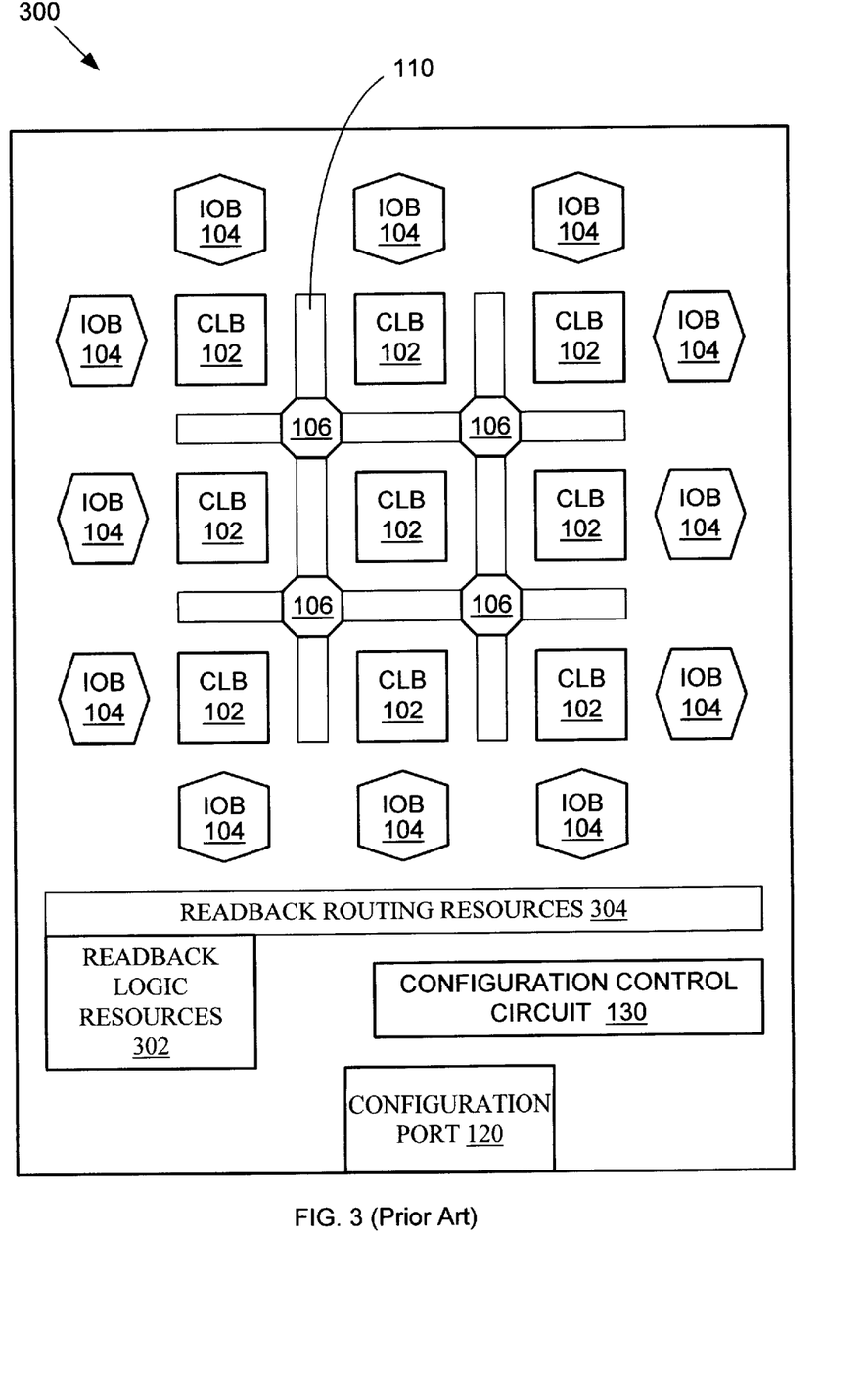
FIG. 3 is a simplified circuit diagram of a conventional FPGA including Readback capability.

An alternative method for testing the operation of a UC is the Readback process, developed by Xilinx, Inc. and used in their XC4000™ series FPGAs. The Readback process addresses some of the resource limitation and signal delay issues of probe circuit testing. FIG. 3 shows a simplified circuit diagram of an FPGA 300, which is consistent with the XC4000-series FPGAs from Xilinx, Inc. FPGA 300 is similar to FPGA 100 (FIG. 1), and comprises an array of CLBs 102 surrounded by a ring of IOBs 104 and interconnected by a CIS 110 including multiple PSMs 106. As in FPGA 100, CLBs 102, IOBs 104, and PSMs 106 in FPGA 300 are configured by a configuration control circuit 130 using data received through a configuration port 120. However, FPGA 300 further includes readback logic resources 302 and readback routing resources 304. Readback logic resources 302 comprise a trigger net (not shown) that can be connected to any IOB 104 by readback routing resources 304. When a low-to-high transition takes place on the trigger net, readback logic resources 302 begin shifting out a data stream that reports the configuration bits of FPGA 300. Readback logic resources 302 can be configured to also include the contents of all flip-flops and latches in FPGA 300 in the readback data stream. This data stream is fed to an IOB that routes the data stream to an external logic analyzer (not shown).

Because the Readback technique utilizes dedicated readback trigger and data collection resources, resource limitation issues are alleviated. None of the logic and routing resources required by the UC are consumed by the testing functions, thereby allowing the full UC to be operated. In addition, as in LSSD testing, only one pin is needed to transmit the data stream to the external logic analysis circuit.

However, as with LSSD testing, the Readback technique can be time-consuming due to the serial nature of the output data stream. This problem is exacerbated by the fact that the data stream format provided by the Readback technique includes both the configuration and state data for the UC, even though the logic analysis circuit generally does not require all the configuration and state data. The extraneous data decreases the effective output rate for the data of interest, while forcing the logic analysis circuit to spend additional processing time to extract the relevant information. Another limitation of the Readback technique is that because the trigger net can monitor only a single IOB 104 (i.e., a single node), the triggering conditions that can be applied are limited. Test nodes within the array of CLBs 102 are isolated from the trigger net and therefore cannot be monitored for use with the trigger logic.

Accordingly, it is desirable to provide a method and apparatus for providing rapid logic analysis for an IC without interfering with normal IC operation.

SUMMARY OF THE INVENTION

The present invention is directed towards apparatus and methods for performing on-chip logic analysis of ICs, overcoming the performance degradation, logic resource limitation, and test speed limitations of conventional logic analysis methods by utilizing the versatility of "multiple-context" PLDs. A multiple-context PLD greatly resembles a conventional PLD, having a similar assortment and arrangement of logic resources (CLBs, IOBs, and CIS). However, in a multiple-context PLD, each configuration memory cell is replaced by a multi-bit configuration memory (MBCM). MBCMs allow multiple user-defined contexts (UCs) to be stored in the PLD. Each UC uses a single memory cell from each MBCM. A multiple-context PLD can rapidly switch between multiple configurations or UCs ("context switching"). In accordance with one embodiment of the invention, the logic resources of the multiple-context PLD include storage elements for storing state data associated with the logic resources. In one embodiment, the storage elements are multi-bit micro-registers that store state data generated by a plurality of contexts implemented in the multiple-context PLD.

In accordance with an embodiment of the present invention, a multiple-context PLD comprises a plurality of logic resources, a configurable interconnect structure (CIS) for interconnecting the logic resources, a plurality of multi-bit configuration memories (MBCMs), and a trigger logic structure. The plurality of MBCMs are programmed such that at least one context of the multiple-context PLD provides a desired user context (DUC) to be tested, while at least one other context provides an on-chip logic analysis context (LAC). During operation of the DUC, a trigger signal from the trigger logic structure causes the multiple-context PLD to be reconfigured into the LAC. In one embodiment of the invention, the logic resources include storage elements (e.g., micro-registers) for storing state data associated with one or more DUCs. By reading the state data from the DUC stored in the micro-registers of the logic resources, the LAC can analyze the performance of the DUC. Upon completion of the testing process, the multiple-context PLD is reconfigured back into the DUC and normal operation resumes. The results of the testing process can be immediately provided to the pins of the multiple-context PLD, or can be stored in a test data storage element of the multiple-context PLD for a subsequent batch output process.

In another embodiment, the micro-registers of the logic resources are used to store stimulus values generated by the LAC (or externally provided and stored in the micro-registers by the LAC). When the PLD is reconfigured back into the DUC, the stimulus values are available to the DUC. The stimulus values thus stimulate the DUC, causing the DUC to operate with these new values. In one embodiment, the new values may be used to correct some adverse condition detected by the LAC. In another embodiment, the new values provide test stimulus, and therefore provide further information for analysis by the next LAC configured into the PLD.

In yet another embodiment, the state values and/or stimulus values are stored in otherwise unused portions of the MBCMs, where the number of defined contexts is fewer than the bit width of the MBCMs.

In accordance with another aspect of the present invention, the trigger logic structure includes a configurable trigger logic circuit and a configurable interconnect matrix. The configurable interconnect matrix enables the configurable trigger logic circuit to monitor any of a plurality of nodes within the multiple-context PLD. The configurable trigger logic structure allows the desired triggering conditions to be defined. The configurable trigger logic structure and configurable interconnect matrix further allow the triggering conditions to be redefined during operation of the multiple-context PLD as desired. In one embodiment, the configurable logic structure includes a clock circuit to enable periodic, time-driven trigger signals as well as event-driven trigger signals.

Numerous benefits accrue from this on-chip logic analysis capability. Because the multiple-context PLD can perform its own logic analysis, an "off-chip" logic analyzer is not required. Testing speed is also improved, because the data signals do not have to travel along long interconnect lines and through pins to an external logic analyzer. Testing validity is enhanced because the full UC is used, without potentially performance-affecting modifications. In addition, the resource limitation issues of conventional logic analysis methods (i.e., pin count, unused logic resources) are avoided because all the logic resources are available for the logic analysis function.

The present invention will be more fully understood in view of the following detailed description and drawings.

BRIEF DESCRIPTION OF THE DRAWINGS

The present invention is illustrated by way of example, and not by way of limitation, in the following figures, in which like reference numerals refer to similar elements.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE DRAWINGS

The following discussion illustrates an embodiment in which the on-chip logic analysis circuit of the present invention is utilized in a programmable logic device (PLD), specifically a Field Programmable Gate Array (FPGA). It should be noted, however, that the disclosed on-chip logic analysis circuit and method may also be implemented in other types of IC devices such as microprocessors and microcontrollers having configurable elements.

Multiple-Context Logic

Figure 4:
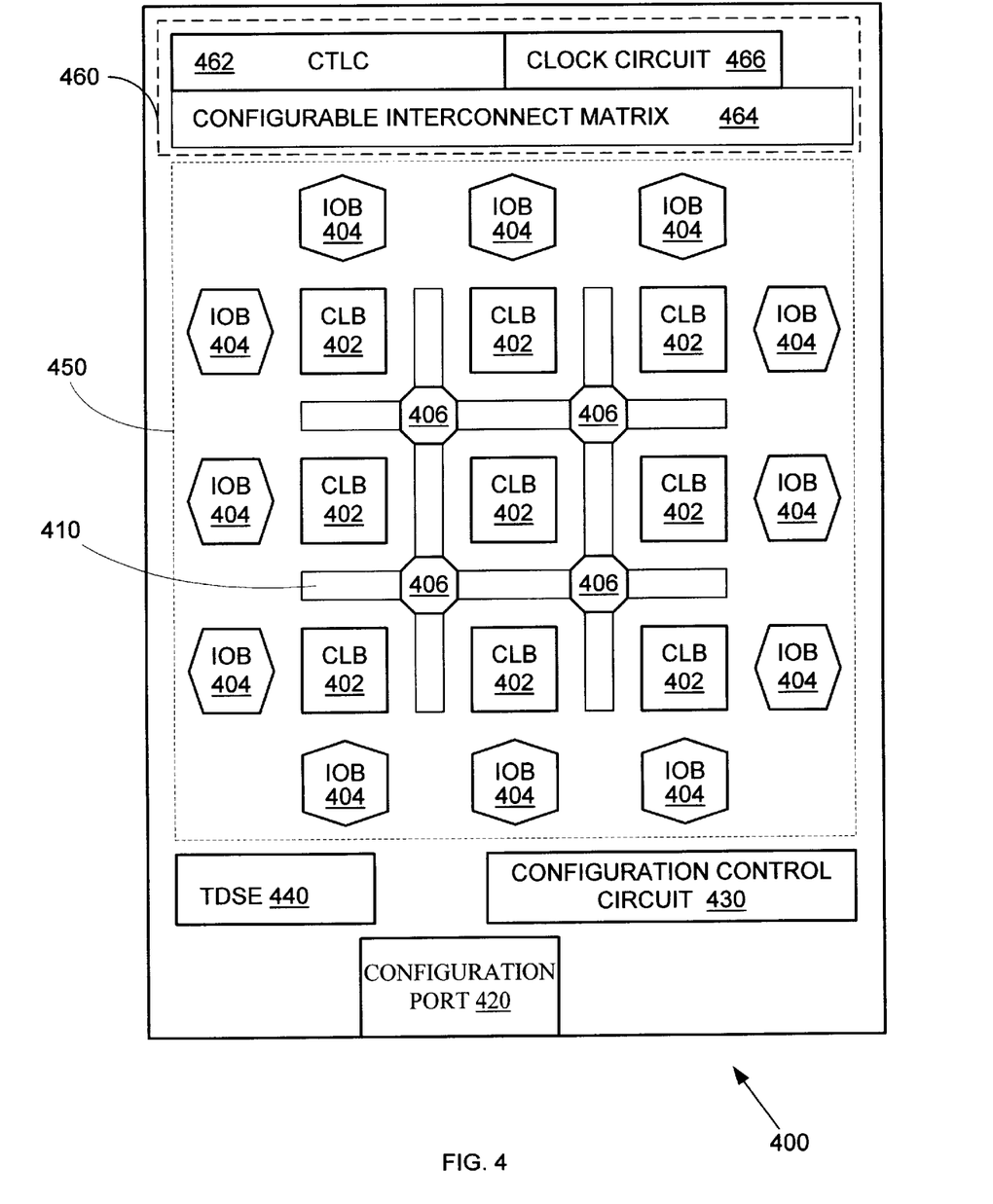
FIG. 4 is a simplified circuit diagram of an FPGA in accordance with an embodiment of the present invention.

FIG. 4 shows an FPGA 400 that represents one of several Programmable Logic Device (PLD) types. FPGA 400 comprises a user-configurable logic structure (UCLS) 450, a configuration control circuit 430, a configuration port 420, a trigger logic structure 460, a test data storage element (TDSE) 440, and a plurality of multi-bit configuration memories (not shown). UCLS 450 includes a plurality of configurable logic blocks (CLBs) 402, a plurality of input/output blocks (IOBs) 404, and a configurable interconnect structure (CIS) 410. CIS 410 comprises a plurality of programmable switch matrices (PSMs) 406 that control the routing of signals between CLBs 402 and IOBs 404.

As in conventional PLDs, the logic resources (CLBs 402, IOBs 404, and PSMs 406) in FPGA 400 all include multiple programmable elements. Each programmable element requires a configuration bit to define a portion of the logical function provided by the associated logic resource. However, each programmable element in FPGA 400 is associated with a multi-bit configuration memory (not shown), rather than being coupled to a single-bit configuration memory cell as in conventional PLDs. As a result, FPGA 400 can be configured to perform a specified task at one instant and then be reconfigured to perform a different task at another instant. FPGA 400 is therefore dynamically, or "flash", reconfigurable. A brief description of the operation of a multiple-context PLD follows. A multiple-context PLD is described in detail in co-owned U.S. Pat. No. 5,646,545, issued Jul. 8, 1997 to Trimberger et al., which is incorporated herein by reference.

Figure 5:
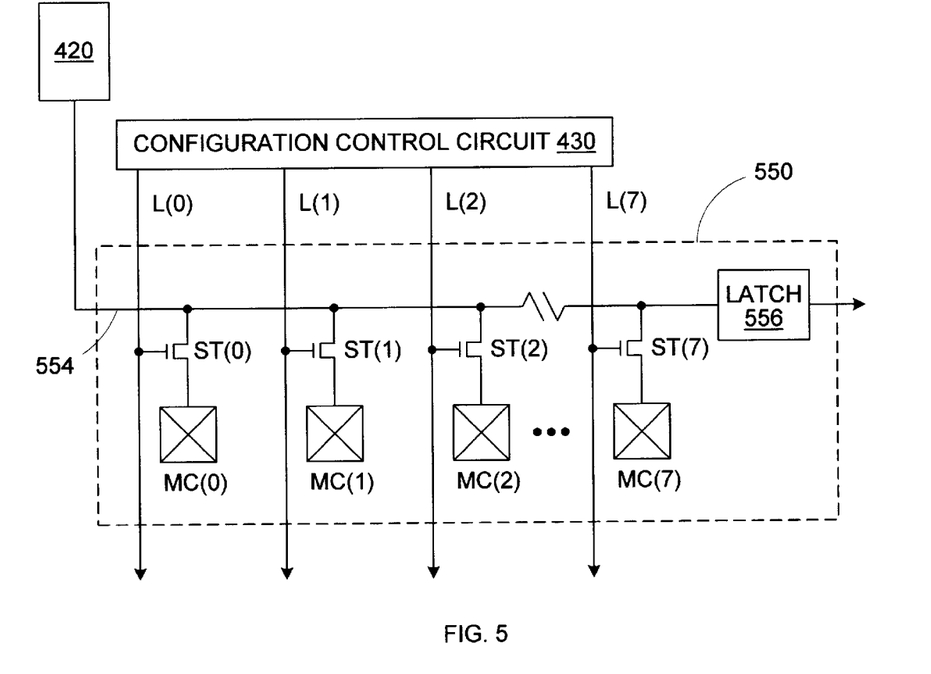
FIG. 5 shows a multi-bit configuration memory for a flash reprogrammable logic resource.

FIG. 5 shows a circuit diagram of a multi-bit configuration memory (MBCM) 550 for configuring a programmable element in a multiple-context PLD. MBCM 550 is depicted as an 8-bit random access memory (RAM), and comprises a conventional latch 556, eight memory cells MC(0)–MC(7), and eight select transistors ST(0)–ST(7). Memory cells MC(0)–MC(7) are coupled to a common configuration data bus 554 by select transistors ST(0)–ST(7), respectively. The gate terminals of select transistors ST(0)–ST(7) are coupled to configuration/read select (CRS) lines L(0)–L(7), which are controlled by configuration control circuit 430.

During initial PLD configuration, MBCM 550 is programmed by a data stream from configuration port 420 and supplied to configuration data bus 554. The storage of configuration data in memory cells MC(0)–MC(7) is then controlled by the signals applied to CRS lines L(0)–L(7) by configuration control circuit 430. For example, when CRS line L(0) is pulled to a logic HIGH state, select transistor ST(0) is turned on, allowing the data on configuration data bus 554 to be written to memory cell MC(0). Memory cells MC(1)–MC(7) can be programmed in a similar fashion.

In a multiple-context PLD, a MBCM 550 is coupled to each programmable element. The maximum number of contexts available for the multiple-context PLD is determined by the bit width of MBCM 550. An 8-bit RAM as shown in FIG. 5 allows switching between up to eight different contexts, each context being defined by a memory slice made up of all the bits stored by memory cells in the same location (e.g., the bits stored in each memory cell MC(3) of all the MBCMs 550).

During normal operation, the active context of the PLD is defined by the memory slice loaded into the latches 556 of MBCMs 550. In each MBCM 550, CRS lines L(0)–L(7) select the memory cell that provides its stored configuration bit to latch 556. For example, when CRS line L(0) is pulled to a logic HIGH state while all other CRS lines are LOW, select transistor ST(0) is turned on, allowing the configuration bit in memory cell MC(0) to be loaded into latch 556. During a flash reconfiguration step, a different CRS line is pulled HIGH, allowing the configuration bit from a different memory cell to be stored in latch 556. The context associated with the newly-loaded memory slice then becomes the active UC.

Figure 6:
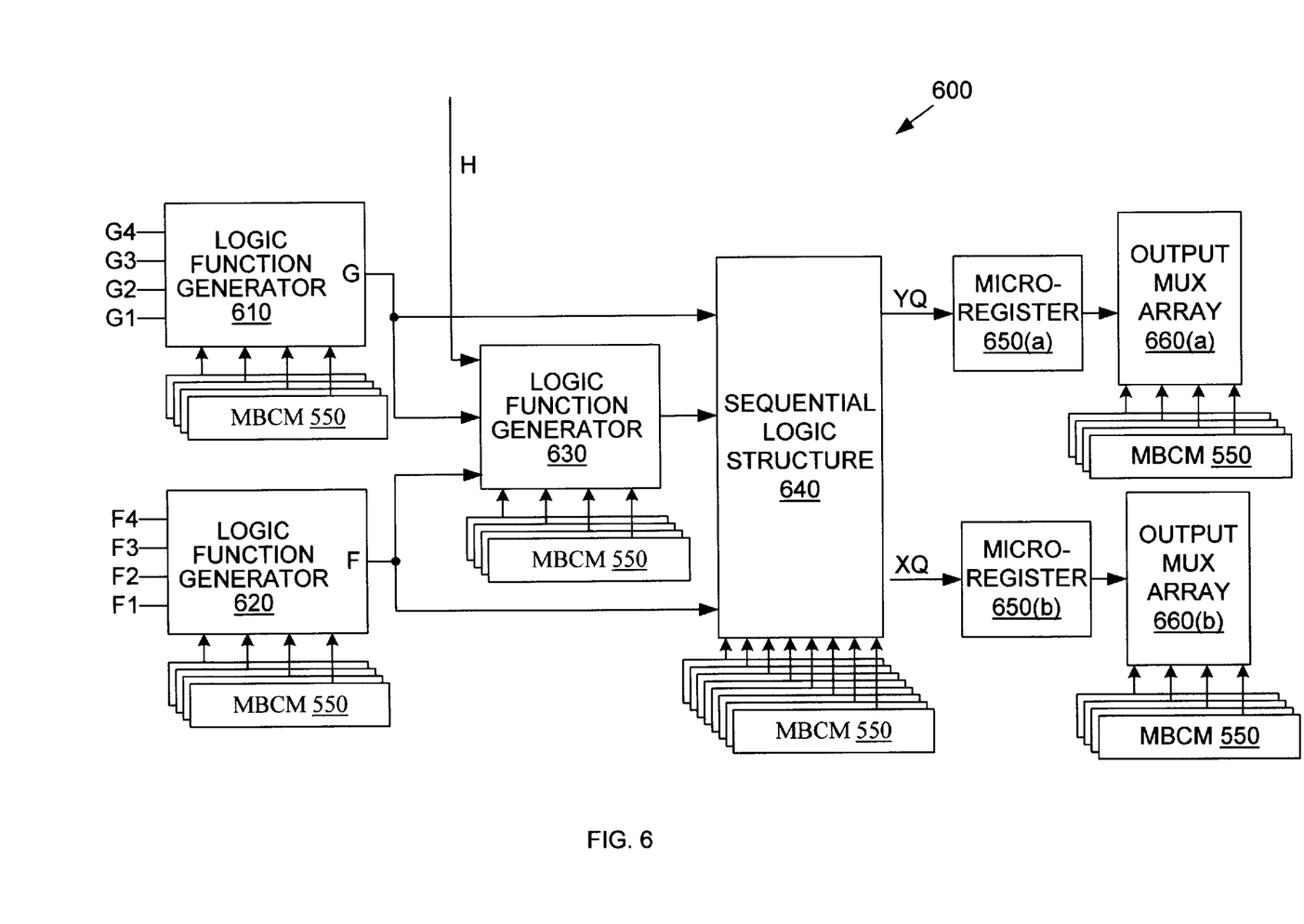
FIG. 6 is a circuit diagram of a flash reprogrammable configurable logic block (CLB).

FIG. 6 shows a circuit diagram of a CLB 600 for a multiple-context PLD. CLB 600 comprises logic function generators (LFGs) 610, 620, and 630, a sequential logic structure 640, micro-registers 650(a) and 650(b), output multiplexer arrays 660(a) and 660(b), and a plurality of MBCMs 550. A MBCM 550 provides a single configuration bit to each programmable element (not shown) in CLB 600. For example, LFG 610 as shown in FIG. 6 includes four programmable elements, and therefore is connected to four MBCMs 550. (LFG 610 and the other components of CLB 600 may actually include larger numbers of programmable elements, which are omitted from FIG. 6 to clarify the drawing.) Similarly, multiple MBCMs 550 are associated with the other components within CLB 600, enabling rapid switching between different contexts.

Although greatly simplified, the arrangement and operation of LFGs 610, 620, and 630, and logic structure 640 in CLB 600 are generally consistent with the arrangement and operation of corresponding components in a CLB of an XC4000-series FPGA from Xilinx, Inc. LFGs 610 and 620 perform desired combinatorial logic functions on input signals G1–G4 and F1–F4, respectively, to generate output signals G and F, respectively. LFG 630 then performs a desired combinatorial logic function on an external input signal H and output signals G and F. The output signals of LFGs 610, 620, and 630 are then fed into sequential logic structure 640, which includes an internal arrangement of multiplexers and flip-flops (not shown) to provide output signals YQ and XQ.

In accordance with one embodiment of the present invention, CLB 600 further comprises micro-registers 650(a) and 650(b) and output multiplexer arrays 660(a) and 660(b). In one embodiment, micro-registers 650(a) and 650(b) each have the same bit width as MBCM 550. Output signals YQ and XQ from sequential logic structure 640 are fed into micro-registers 650(a) and 650(b), respectively. When a context switch occurs, output signals YQ and XQ are stored in micro-registers 650(a) and 650(b), respectively. Once this state data has been stored in the micro-registers, a new memory slice is loaded from MBCMs 550 and the new context becomes active. Output multiplexer arrays 660(a) and 660(b) then provide the new context with access to the state data generated by the previously active context or contexts and stored in micro registers 650(a) and 650(b).

As previously described, in one embodiment the micro-registers of the logic resources are used to store stimulus data generated by the LAC. In this embodiment, the CLB includes an array of one or more input multiplexers providing data to the micro-registers. (In FIG. 6, the input multiplexers would be located between sequential logic structure 640 and the micro-registers 650(a) and 650(b).) The input multiplexer array is thus configured to write the selected stimulus data to a desired location in the micro-registers. The micro-registers then provide the stimulus data to the next CLB in the logic chain. In effect, the micro-register substitutes the stored stimulus data for the data generated by sequential logic structure 640.

On-Chip Logic Analysis

In accordance with one embodiment of the present invention, FPGA 400 is configured to include a first memory slice to configure FPGA 400 in a desired user context (DUC), and a second memory slice to configure FPGA 400 in a logic analysis context (LAC). The LAC is designed to analyze the performance of the DUC, and as such depends on the function provided by the DUC. The design process for such a logic analysis function is well known in the art and is therefore not described here.

Trigger logic structure 460 (FIG. 4) controls the activation of the LAC of FPGA 400. Specifically, trigger logic structure 460 includes a configurable trigger logic circuit (CTLC) 462, a clock circuit 466, and a configurable interconnect matrix (CIM) 464. CIM 464 provides configurable interconnections between CTLC 462 and UCLS 450, allowing CTLC 462 to monitor state data at various test nodes within the active context of FPGA 400. The logic and interconnect resources of CTLC 462 and CIM 464 are separate from the resources of UCLS 450, allowing trigger logic structure 460 to be configured as required to provide a desired triggering function. According to one aspect of the present invention, trigger logic structure 460 provides a trigger signal upon detection of a pre-defined set of events during operation of the DUC. According to another aspect of the present invention, the trigger signal is generated at pre-defined intervals based on a clock signal from clock circuit 466. According to another aspect of the present invention, the trigger signal is generated at the earlier of a pre-defined interval based on the clock signal from clock circuit 466 and a pre-determined set of events in the DUC. If no timing-based method is used, clock circuit 466 can be omitted from trigger logic structure 460. The trigger signal causes the active context of PLD 400 to switch from the DUC to the LAC, thereby initiating testing of the DUC.

In one embodiment of the present invention, CIM 464 is fully configurable to connect CTLC 462 with any node within UCLS 450. As a result, the variety of triggering functions available from trigger logic structure 460 is maximized. In another embodiment of the present invention, CIM 464 is partially configurable and can connect CTLC 462 with only certain pre-determined nodes within UCLS 450. As a result, both the design of the DUC and the flexibility of the triggering function available from trigger logic structure 460 is limited. However, by properly selecting the nodes accessible to CIM 464, the restrictions can be minimized, while reducing the overall complexity of trigger logic structure 460.

In another embodiment of the present invention, trigger logic structure 460 includes a clock circuit 466 that provides a regular clock signal. Trigger logic structure 460 provides trigger signals at user-selected intervals based on the regular clock signal. Trigger logic structure 460 can also be configured to monitor the activity of UCLS 450 and generate a trigger signal when a pre-determined set of events is detected, after a pre-determined interval, or after whichever occurs first.

Once the LAC has been loaded, the state data stored in the micro-registers of the logic resources in UCLS 450 is processed. According to one aspect of the present invention, the LAC distributes test data (i.e., test results) to the pins of the PLD immediately after completion of testing. From the pins, the results are sent to an external destination for evaluation or storage. Because the LAC can utilize all the logic resources of the PLD, the test data can be rapidly output in parallel through multiple pins of the PLD.

In accordance with another aspect of the present invention, rather than immediately sending the test data to the external destination, the LAC stores the test data in TDSE 440 upon completion of testing. The next time the test process is run, the new results are also stored in TDSE 440. At a pre-determined time, for example, after a pre-defined number of test cycles or after a pre-defined duration of DUC operation, the test data stored in TDSE 440 are provided in a batch. This technique minimizes the amount of time required by the LAC for testing, and also provides an opportunity for elements that interface with FPGA 400 to be reconfigured for optimal data reception. In addition, the on-chip storage capability provided by TDSE 440 enables on-chip comparison and cross-referencing of the multiple sets of test data. In one embodiment, these comparison and cross-referencing capabilities are designed into the LAC.

Testing Methodology

Figure 7:
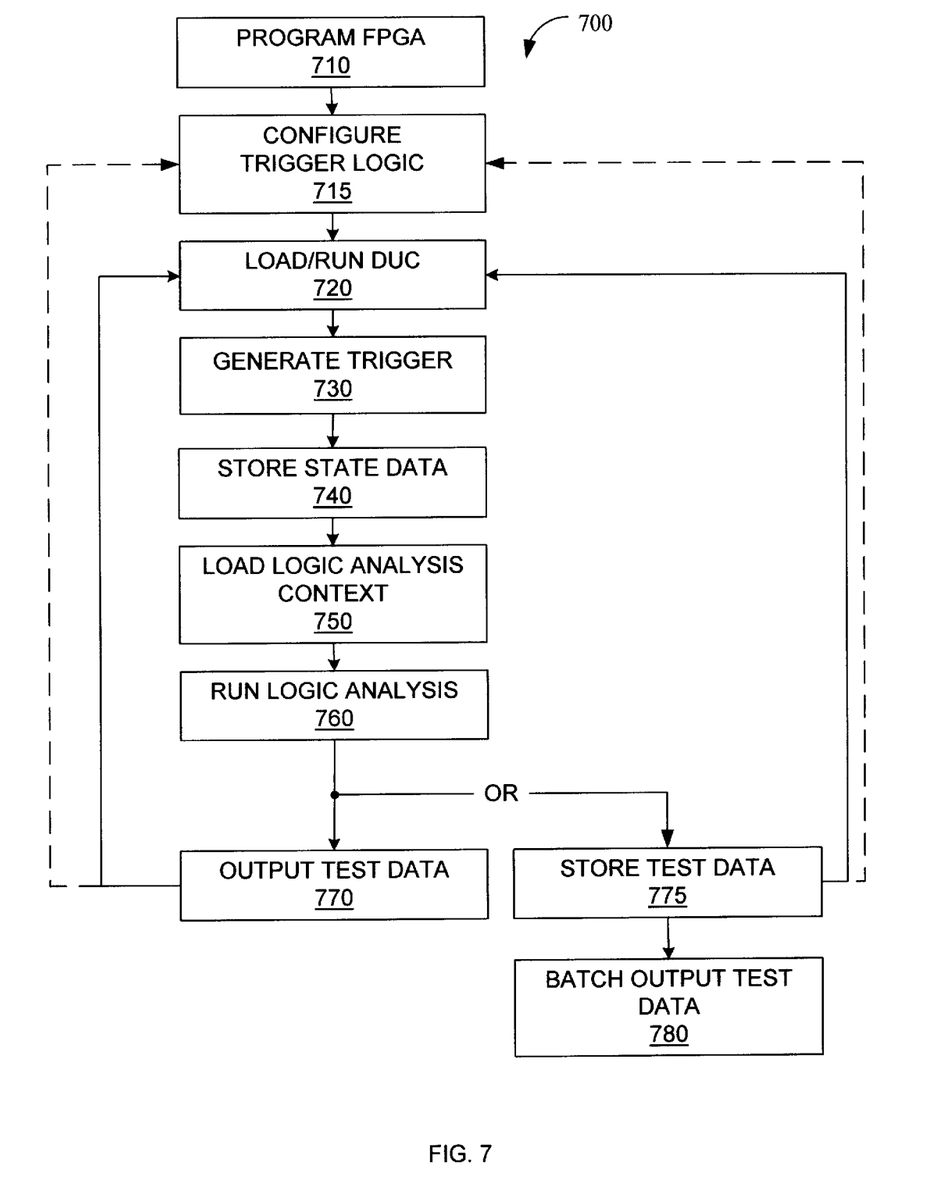
FIG. 7 is a flow chart showing the steps involved in the utilization of context switching in a multiple-context PLD to provide on-chip logic analysis.

FIG. 7 is a flow chart 700 describing the steps involved in an on-chip logic analysis method according to one embodiment of the present invention. Flow chart 700 references FPGA 400 (FIG. 4) and multiple-context CLB 600 (FIG. 6). Although flow chart 700 references an FPGA, a similar methodology can be used with other types of multiple-context PLDs.

First, FPGA 400 is programmed (step 710) by loading all MBCMs 550 associated with CLBs 102, IOBs 104, and PSMs 106 with the desired memory slices. A first memory slice corresponds to a DUC, and a second memory slice corresponds to an LAC for verification of the DUC. Additional memory slices providing additional user contexts and logic analysis contexts may be included as desired. To program FPGA 400, a configuration data stream is sent to configuration port 120. Configuration control circuit 430 regulates CRS lines L(0)–L(7) (FIG. 5) to ensure proper storage of the configuration data in the memory cells of each MBCM 550. While a serial method for programming FPGA 400 has been described, any other known programming method can also be used, such as parallel and partial reconfiguration methods.

Next, trigger logic structure 460 is configured (step 715) to provide trigger signals when pre-defined trigger conditions are met during the operation of the DUC. As described previously, the generation of the trigger signals can be either event- or time-driven. Because CTLC 462 and CIM 464 are independent of the logic and interconnect resources of FPGA 400, they can be configured before step 710, concurrently with step 710, or even after the DUC has begun operation.

At step 720, the first memory slice is loaded to configure FPGA 400 as the DUC. Specifically, configuration control circuit 430 causes MBCMs 550 to load the first memory slice into latch 556 (FIG. 5) to configure the programmable elements of UCLS 450. The DUC becomes the active context and can then be operated in its intended manner.

Once the DUC begins operation, detection of the pre-defined triggering conditions causes trigger logic structure 460 to generate the trigger signal (step 730). Because CTLC 462 and CIM 464 are completely separate from the general pool of user-configurable logic and routing resources in UCLS 450, the test nodes of the DUC can be monitored without affecting the performance of the DUC.

At step 740, upon generation of the trigger signal, each micro-register 650(a) and 650(b) stores the state data generated by the DUC. This data storage preferably takes place immediately after generation of the trigger signal, to capture the state of the DUC at the desired instant. In an alternative embodiment of the present invention, data buffers (not shown) are included in the micro-registers to compensate for any propagation delay associated with the trigger signal. The data buffers continually store a time-slice of the state data generated by the DUC, ensuring that the state data of interest is properly captured.

At step 750, after each micro-register 650(a) and 650(b) has completed storage of the state data from its respective logic element, configuration control circuit 430 loads the second memory slice into latch 556 (FIG. 5) to configure the programmable elements of FPGA 400, thereby implementing the LAC. In accordance with one aspect of the present invention, this context switch takes place in response to the trigger signal. Depending on the time required for the micro-registers to store the state data, delay logic can be included in the CRS control circuit. The delay logic provides a desired time interval between the reception of the trigger signal and initiation of the context switch from the DUC to the LAC. In accordance with another aspect of the present invention, the context switch is initiated by the configuration control circuit in response to a "storage complete" signal from the micro-registers.

At step 760, the LAC programmed into FPGA 400 reads and processes the state data stored in the micro-registers of the logic resources of UCLS 450. As described above, the LAC gains access to the state bits from the DUC through output multiplexer arrays 660(a) and 660(b) associated with micro-registers 650(a) and 650(b), respectively. Output multiplexer arrays 660(a) and 660(b) can also provide access to multiple data bits stored in micro-registers 650(a) and 650(b), respectively. This capability, for example, allows the LAC to compare and analyze state data from the prior operation of multiple DUCs or multiple runs of the same DUC.

At step 770, upon completion of the logic analysis process, the test data is provided by the LAC to the pins of FPGA 400. Because the LAC can utilize the full complement of IOBs 104, the test data can be rapidly provided in parallel on multiple pins, rather than being slowly transmitted in a serial data chain on a single pin. Once the test data has been transmitted, configuration control circuit 430 reloads the first memory slice into latch 556 (FIG. 5) to reconfigure the programmable elements of PLD 400, and resume operation of the DUC (step 720). Optionally, as shown by the dashed arrow from step 770 to step 715, trigger logic structure 460 can also be reconfigured to provide a different triggering function. In any case, the process continues looping until a desired number of test cycles is completed, a desired test duration is reached, or FPGA 400 receives a signal that the testing is to be concluded.

In accordance with an alternative embodiment of the present invention, the test data from the LAC is stored in TDSE 440, which is sized to hold the results from multiple test cycles. Upon completion of a logic analysis test cycle (step 760), the test data is stored in TDSE 440 (step 775), rather than being immediately provided to the pins of PLD 400. The process then continues with the same steps that follow Step 770, reloading and resuming operation of the original DUC. After a specified number of test cycles, clock cycles, or any other desired measure, the test data stored in the memory elements is provided to the FPGA pins in a single batch transfer (step 780).

The foregoing description is meant to provide an understanding of the present invention and is not intended to limit the scope of the present invention to the particular embodiments described. Numerous variations and modifications will be apparent to one skilled in the art. For example, multiple memory slices corresponding to different DUCs can be programmed during the initial PLD configuration step (step 710). Then, after each completion of the logic analysis step (i.e., after step 770 or 775), a different memory slice could be loaded (step 720) to enable testing of a different DUC. Also, rather than being "fully configurable", CTLC 462 and CIS 410 could include selected "hard wired" connections to specific nodes within the logic and routing resources of FPGA 400, with simple logic for selecting the nodes of interest. Such an approach would reduce chip cost and complexity, but at a cost of reduced flexibility in the definition of trigger conditions. Finally, as mentioned previously, the present invention can be used in other types of multiple-context PLDs, such as CPLDs and ASICs. Thus, the present invention is limited by only the following claims.

What is claimed is:

1. A programmable logic device (PLD), comprising:
a user-configurable logic structure having a plurality of configurable logic resources interconnected by a configurable interconnect structure;
a plurality of multi-bit configuration memories coupled to said user-configurable logic structure, wherein each of said multi-bit configuration memories comprises a plurality of configuration memory cells;
a configuration control circuit coupled to said plurality of multi-bit configuration memories and configured to select a first set of configuration memory cells to apply to the user-configurable logic structure; and
a trigger logic structure coupled to said configuration control circuit and configured to cause the configuration control circuit to select a second set of configuration memory cells to apply to the user-configurable logic structure.

2. The PLD of claim 1, wherein each of the plurality of configurable logic resources comprises a state data storage element.

3. The PLD of claim 2, wherein the state data storage element comprises a multi-bit micro-register.

4. The PLD of claim 1, wherein the each of the configurable logic resources comprises an output multiplexer array for selectably reading state data stored in the state data storage element.

5. The PLD of claim 1, wherein the trigger logic structure comprises:
a configurable trigger logic circuit; and
a configurable interconnect matrix configured to couple the trigger logic circuit with the user-configurable logic structure.

6. The PLD of claim 5, wherein the trigger logic structure further comprises a clock circuit.

7. The PLD of claim 1, further comprising a test data storage element configured to store test data generated by the user-configurable logic structure.

8. The PLD of claim 1, wherein each of the plurality of configurable logic resources comprises a stimulus data storage element.

9. The PLD of claim 8, wherein the stimulus data storage element comprises a multi-bit micro-register.

10. A programmable logic device (PLD), comprising:
a plurality of configurable logic resources;
a configurable interconnect structure coupled to the plurality of configurable logic resources;
a plurality of configuration memories coupled to said plurality of configurable logic resources, said configuration memories comprising:
a first set of configuration memory cells for configuring the PLD in a first desired user configuration; and
a second set of configuration memory cells for configuring the PLD in a first logic analysis configuration to test the desired user configuration.

11. The PLD of claim 10, wherein:
each of the plurality of configurable logic resources generates state data; and
each of the plurality of configurable logic resources comprises a storage element configured to store the state data.

12. The PLD of claim 11, wherein:
the storage element comprises a multi-bit micro-register; and
each of the plurality of configurable logic resources further comprises an output multiplexer array configured to read state data from a desired location in the storage element.

13. The PLD of claim 10, further comprising:
a trigger logic structure; and
a configuration control circuit coupled to the trigger logic structure for switching the configuration of the PLD from the first desired user configuration to the first logic analysis configuration.

14. The PLD of claim 13, wherein the trigger logic structure comprises:
a configurable trigger logic circuit; and
a configurable interconnect matrix for interconnecting the configurable trigger logic circuit with the plurality of configurable logic resources.

15. The PLD of claim 10, further comprising a test data storage element configured to store test data generated by the plurality of configurable logic resources.

16. The PLD of claim 10, wherein the plurality of configuration memories further comprises a third set of configuration memory cells for configuring the PLD in a second desired user configuration.

17. The PLD of claim 10, wherein the plurality of configuration memories further comprises a third set of configuration memory cells for configuring the PLD in a second logic analysis configuration.

18. The PLD of claim 10, wherein:
the logic analysis configuration generates stimulus data; and
each of the plurality of configurable logic resources comprises a storage element configured to store the stimulus data.

19. The PLD of claim 18, wherein:
the storage element comprises a multi-bit micro-register; and
each of the plurality of configurable logic resources further comprises an input multiplexer array configured to write stimulus data to a desired location in the storage element.

20. In a programmable logic device (PLD), a method for testing a desired user configuration comprising:
programming a plurality of memory slices into a plurality of multi-bit configuration memories in the PLD;
loading a first one of the plurality of memory slices to configure the PLD into the desired user configuration;
operating the PLD in the desired user configuration;
generating a first trigger signal;
loading a second one of the plurality of memory slices in response to the first trigger signal to configure the PLD into a first logic analysis configuration; and
analyzing the performance of the desired user configuration using the first logic analysis configuration.

21. The method of claim 20, further comprising configuring a trigger logic structure in the PLD.

22. The method of claim 20, wherein the step of generating the first trigger signal comprises detecting a pre-determined time interval.

23. The method of claim 20, wherein the step of generating the first trigger signal comprises detecting a pre-determined set of events in the desired user configuration.

24. The method of claim 20, wherein the step of generating the first trigger signal comprises detecting an earlier of a pre-determined time interval and a pre-determined set of events in the desired user configuration.

25. The method of claim 20, further comprising:
reloading the first one of the plurality of memory slices to reconfigure the PLD into the desired user context; and
resuming operation of the desired user context.

26. The method of claim 20, further comprising storing state data generated by the desired user configuration in a plurality of state data storage elements.

27. The method of claim 26, wherein the step of analyzing the desired user configuration comprises:
reading the state data stored in the plurality of state data storage elements;
processing the state data to generate a set of test data; and
distributing the set of test data to one or more pins in the PLD.

28. The method of claim 26, wherein the step of analyzing the desired user configuration comprises:
reading the state data stored in the plurality of state data storage elements;
processing the state data to generate a set of test data; and
adding the set of test data to an aggregate data set stored in a test data storage element in the PLD.

29. The method of claim 28, further comprising distributing the aggregate data set to one or more pins in the PLD.

30. The method of claim 20, further comprising:
reloading the first one of the plurality of memory slices to reconfigure the PLD into the desired user configuration;
resuming operation of the PLD in the desired user configuration;
generating a second trigger signal;
loading a third one of the plurality of memory slices in response to the second trigger signal to configure the PLD into a second logic analysis configuration; and
analyzing the performance of the desired user configuration using the second logic analysis configuration.

31. The method of claim 20, further comprising storing stimulus data generated by the logic analysis configuration in a plurality of stimulus data storage elements.

* * * * *